(12) United States Patent
Alenin et al.

(10) Patent No.: US 7,339,402 B2
(45) Date of Patent: Mar. 4, 2008

(54) DIFFERENTIAL AMPLIFIER WITH OVER-VOLTAGE PROTECTION AND METHOD

(75) Inventors: Sergey V. Alenin, Tucson, AZ (US); Henry Surtihadi, Tucson, AZ (US)

(73) Assignee: Texas Instruments Incorporated, Dallas, TX (US)

(*) Notice: Subject to any disclaimer, the term of this patent is extended or adjusted under 35 U.S.C. 154(b) by 74 days.

(21) Appl. No.: 11/353,186

(22) Filed: Feb. 13, 2006

(65) Prior Publication Data

US 2007/0188191 A1   Aug. 16, 2007

(51) Int. Cl.
*G06G 7/12* (2006.01)
*H03K 19/00* (2006.01)

(52) U.S. Cl. .................. 326/109; 326/126; 326/83
(58) Field of Classification Search ............. 326/126, 326/83, 109; 327/560, 561, 562, 563; 330/252, 330/253
See application file for complete search history.

(56) References Cited

U.S. PATENT DOCUMENTS 5,982,692 A * 11/1999 Lattimore et al. .......... 365/208

6,833,737 B2 * 12/2004 Aipperspach ................ 327/55

* cited by examiner

*Primary Examiner*—Daniel Chang
(74) *Attorney, Agent, or Firm*—Wade J. Brady, III; Frederick J. Telecky, Jr.

(57) ABSTRACT

Circuitry for preventing damage to bipolar transistors in integrated circuit amplifier circuitry during slew-limited operation includes first and second transistors, each having first, second, and third electrodes, a first one of the first and second electrodes of the first transistor being coupled to receive a first signal, and a first one of the first and second electrodes of the second transistor being coupled to receive a second signal. A first separator transistor having a first current-carrying electrode coupled to the first one of the first and second electrodes of the first transistor and a second current-carrying electrode coupled to the first one of the first and second electrodes of the second transistor is controlled so as to electrically isolate the first one of the first and second electrodes of the first transistor from the first one of the first and second electrodes of the second transistor in response to the first and second signals to limit a reverse bias voltage across a PN junction of one of the first and second transistors.

18 Claims, 5 Drawing Sheets

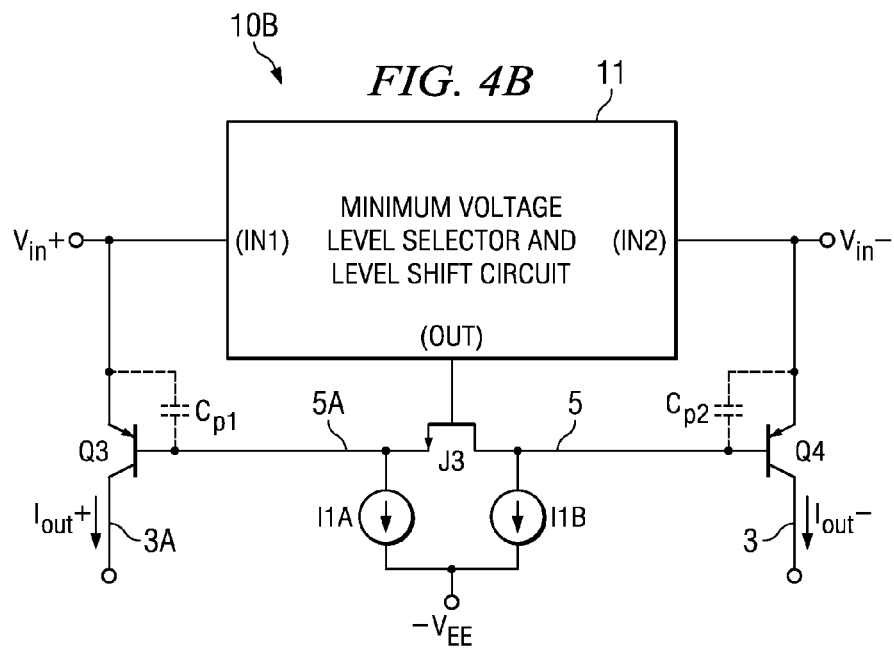
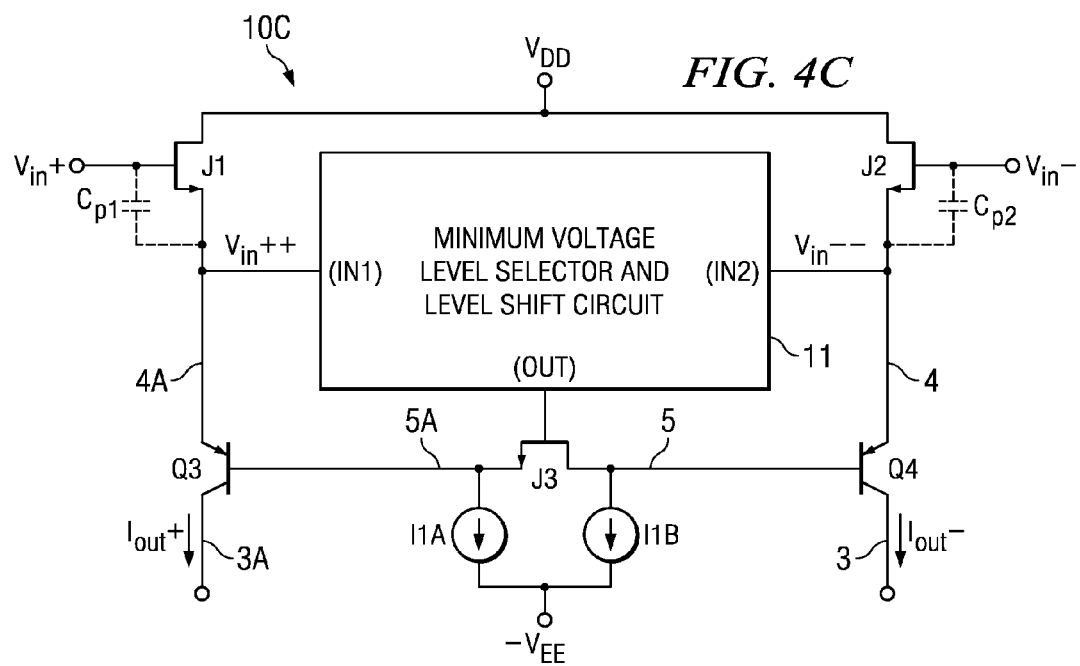

DIFFERENTIAL AMPLIFIER WITH OVER-VOLTAGE PROTECTION AND METHOD

BACKGROUND OF THE INVENTION

The present invention relates generally to amplifiers, and more particularly to improved over-voltage protection for differential amplifiers.

Most high voltage operational amplifiers use some type of input over-voltage protection, only a few of which are "robust", for example those using a lateral-PNP input stage or simple high voltage JFET input stage. A typical bipolar differential input stage as shown in FIG. 1, for example, is protected against differential input voltages of up to about 0.7 volts by means of a pair of diodes D1 and D2 coupled in opposite directions across the input limiting differential voltage, but this protection is achieved at the cost of a very large input current flowing through the protection diodes D1 and D2 if the input differential voltage magnitude exceeds about 0.7 volts.

More complicated input stages like the common-drain-common-base topologies shown in FIGS. 2 and 3 usually do not have input protection diodes as shown in FIG. 1, but they have an internal diode clamp protecting the bipolar portion of the input stage. This type of input stage relies on the high breakdown voltage of JFETs and provides good DC performance (e.g., low input bias current) even for a differential input voltage value approaching the full supply voltage. However, a transient response problem exists in operational amplifiers of the type using common-drain-common-base input stages which utilize an over-voltage protection clamp circuit. The transient response problem is especially pronounced when large input transistors with large parasitic capacitances are utilized.

The input stage circuits 1A and 1B shown in FIGS. 2 and 3, respectively, use common-drain-common-base topology and require protection from a large differential voltage between the emitter of transistor Q3 and the emitter of transistor Q4. FIG. 2 shows a complete operational amplifier including a conventional input stage 1A and a conventional output stage 2. Conventional output stage 2 can be used in conjunction with various improved input stages (subsequently described) of the present invention. During certain modes of operation of the operational amplifier, for example during slewing operation, large input differential voltages may appear. If a positive, high slew rate input signal Vin+ is applied to the gate of transistor J1 (i.e., to the non-inverting input of the operational amplifier) in FIG. 3, the emitter voltage of transistor Q3 also will rise as fast as the input signal Vin+. However, the gate voltage Vin− of transistor J2 would be coupled by a feedback element to the output of the operational amplifier, so the emitter voltage of transistor Q4 would only rise as fast as the slew rate of the output of the operational amplifier. If the slew rate of the operational amplifier output stage is much slower than the input signal slew rate of Vin+, there will be a large voltage difference between the emitters of transistors Q3 and Q4. In this example, the base-emitter junction of transistor Q4 will be highly reverse biased. This is problematic because typically the base-emitter junction of an integrated circuit bipolar transistor can not be reverse biased by more than about 2 to 3 volts without permanently damaging the transistor.

A typical clamp circuit that can solve the foregoing problem of permanently damaging transistors Q3 and Q4 includes a pair of strings of diodes D11 . . . D1n and D21 . . . D2n coupled between the emitters of transistors Q3 and Q4, as shown in FIG. 3. This clamp circuit limits the voltage difference between the emitters of transistors Q3 and Q4 so as to limit the amount of reverse bias voltage across the base-emitter junction of transistor Q4 for positive slewing (or Q3 for negative slewing) to a value below its maximum allowed value. (Note that this type of clamp circuit cannot be used if bipolar transistors are used as the input transistor pair, because it may excessively reverse bias the base-emitter junction of the bipolar transistor corresponding to JFET J2. In contrast, if JFETs are used as the input transistors, their gate-source junctions typically can withstand the amount of reverse bias that the clamp circuit causes.) Unfortunately, the clamp circuit of FIG. 3 has the problem that it causes charging of the large gate-source parasitic capacitors Cp1 and Cp2, which can degrade the output slew rate of the output stage of the operational amplifier. During slewing in the positive direction, a large differential input signal Vin=Vin+-Vin− is applied to input stage 1B, causing the diode clamp circuit D11 . . . D1n to turn on and limit the amount of reverse bias voltage across the base-emitter junction of transistor Q4. At the same time, the gate-source junction of input transistor J2 is reverse biased and the parasitic capacitor Cp2 is charged up to the value of the input signal Vin=Vin+-Vin− minus the voltage drop across the clamp circuit. As the slew-limited inverting input voltage Vin− is slowly slewing up, the source voltage of input transistor J2 tracks it, thereby increasing the emitter voltage of transistor Q4 and turning it on. At that moment the charged-up parasitic capacitor Cp2 begins to discharge into the emitter of transistor Q4. If parasitic capacitor Cp2 is large, the resulting parasitic capacitance discharge current ($I_{Cpar}$) discharged through transistor Q4 also is large. At this point, it should be noted that in the ideal case, in which the parasitic capacitance is small, transistors J1, Q3, Q5 and Q6 are conducting maximum current during positive slewing to produce the recharging current Iout1, whereas transistors J2 and Q4 should be completely off. But due to the above described parasitic capacitor Cp2 discharge, transistor Q4 actually steals a substantial fraction of the current Iout1, which reduces the slew rate of the amplifier.

In the case of large gate-source parasitic capacitance Cp2 as shown in FIG. 3, the associated parasitic charging current $I_{Cpar}$ described above can approach the magnitude of the amount of tail current I1*A₁ available to the differential input transistors J1 and J2. (Here, A1 is the current gain of transistors Q3 and Q4 (beta). In practice, for better amplifier performance the current gain A1 is limited to a lower value by means of additional scaling diodes such as diode-connected transistors Q3B and Q4B in subsequently described FIGS. 5 and 6. In that case the current gain A1 is equal to the ratio of the emitter area of transistor Q4 (Q3) to the emitter area of transistor Q4B (Q33B), which is better controlled than the transistor current gain beta.) In the case in which $I_{Cpar}$ is large, Iout1, which is the difference in the current through transistors Q6 and Q4 (I1*A1-$I_{Cpar}$), becomes substantially smaller than I1*A₁. As a result, the compensation capacitor Ccomp (see FIG. 2) of the operational amplifier output stage 2 is charged at a lower rate than in the ideal case. This degrades the slew rate of the operational amplifier in FIG. 2, the slew rate being S=(I1*A₁-$I_{Cpar}$)/Ccomp, especially when the input stage receives a large input swing that causes the above-mentioned clamp circuit to turn on and begin the input parasitic capacitor charge-discharge process.

Another problem associated with the above described parasitic capacitance discharging current is high differential input capacitance and input error caused by the resulting high parasitic capacitance recharging currents reacting with the input signal source impedances. This problem has two aspects. The first aspect is just the amount of charge flowing through the input during an input voltage transient, wherein the larger the voltage change across the parasitic capacitance Cp2, the greater the amount of parasitic capacitor discharging current. The second aspect is the nonlinearity of the phenomenon. On the positive input signal edge, the source voltage of the input JFET J1 follows its gate voltage, and the VGS modulation and Cp1 recharge current are low, whereas the Cp2 recharge current is large. On the negative input signal edge the resulting large amplitude source voltage of input transistor J1 does not follow its gate voltage and is determined by the other input voltage minus the voltage drop across the diode clamp circuit. That causes a substantial recharge current flowing through the gate of the input JFET, i.e., the input of the amplifier. So the input current and the product of its reaction with the input signal source impedance is substantially different for positive and negative edges of the input signal, and this is a nonlinear "external" effect of amplifier which adds to the internal nonlinearity of the amplifier. Another possible problem is that if on a positive edge of the input signal the Cp2 recharge current is very large, it can exceed the $I_{DSS}$ specification value of input transistor J1 and its gate-source p-n junction will be forward biased, which can cause very large settling times, large transient bias currents, etc.

Another problem of over-voltage protection of an input stage with the diode clamp circuit D11 . . . D1n, D21 . . . D2n of FIG. 3 is that the maximum input voltage is limited by the VGS breakdown voltage of the input JFETs. This may be of concern because wafer fabrication techniques which improve JFET performance often cause reduction of the VGS breakdown voltages of JFETs. Consequently,. with such reduced breakdown voltage it becomes impossible to provide high (i.e., full supply voltage) absolute maximum differential voltage specifications when using diode clamp protection circuits having low clamp voltage.

There is an unmet need for an input stage which avoids large modulation of voltage across the parasitic capacitors of the input transistors (which large modulation generates large parasitic currents that degrade performance of the amplifier) while also effectively preventing damage caused by excessive reverse bias voltage across emitter-base junctions of transistors in the input stage.

There is an unmet need for an input stage which avoids degrading transient response of the amplifier and, in particular, the slew rate of an amplifier caused by unwanted currents through parasitic capacitors associated with input transistors.

There also is an unmet need for an input stage with reduced input errors caused by charging currents through parasitic capacitances of input transistors of the input stage.

There is an unmet need for an input stage which allows for using high-performance transistors but with lower breakdown voltage by avoiding large modulation of gate-to-source voltage of the input transistors while still providing high (full supply voltage) absolute maximum values of the input differential voltage.

There is an unmet need for a bipolar input stage which maintains low input bias current with substantially higher than 0.7 volt maximum input differential voltage (which ideally is equal to the full supply voltage) wherein at the same time the base-emitter junctions of the input transistors are fully protected from high input differential voltages.

SUMMARY OF THE INVENTION

It is an object of the invention to provide an input stage and method which avoid large modulation of voltage across gate-source or base-emitter junctions of the input transistors of an input stage while also effectively preventing damage caused by excessive reverse bias voltage across emitter-base junctions of transistors in the input stage.

It is another object of the invention to provide an input stage and method which avoid degrading of the transient response and, in particular, slew rate of an amplifier caused by large recharging currents through parasitic capacitances of input transistors of the input stage.

It is another object of the invention to provide an input stage and method with reduced input errors caused by charging currents through parasitic capacitances of input transistors of the input stage.

It is another object of the invention to provide an input stage which allows the use of high-performance transistors but with lower breakdown voltage by avoiding large modulation of gate-to-source voltage of the input transistors while still providing high (full supply voltage) absolute maximum values of the input differential voltage.

It is another object of the invention to provide a bipolar input stage which maintains low input bias current with substantially higher than 0.7 volt maximum input differential voltage (which ideally is equal to the full supply voltage) wherein at the same time the base-emitter junctions of the input transistors are fully protected from high input differential voltages.

Briefly described, and in accordance with one embodiment, the present invention provides amplifier circuitry including an input stage (10A-C) which includes first (Q1 or Q3) and second (Q2 or Q4) transistors, each having first, second, and third electrodes, a first one of the first and second electrodes of the first (Q1 or Q3) transistor being coupled to receive a first signal (Vin+or Vin++), and a first one of the first and second electrodes of the second (Q2 or Q4) transistor being coupled to receive a second signal (Vin−or Vin−−). A first separator transistor (J3) has a first current-carrying electrode coupled to the second one of the first and second electrodes of the first transistor (Q1 or Q3) and a second current-carrying electrode coupled to the second one of the first and second electrodes of the second transistor (Q2 or Q4). A control circuit (11) has a first input (IN1) coupled to the first one of the first and second electrodes of the first transistor (Q1 or Q3), a second input (IN2) coupled to the first one of the first and second electrodes of the second transistor (Q2 or Q4), and an output (OUT) coupled to a gate of the first separator transistor (J3) for controlling the first separator transistor (J3) in response to the first (Vin+or Vin++) and second (Vin−or Vin−−) signals so as to limit a reverse bias voltage across a PN junction of one of the first (Q3) and second (Q4) transistors. Bias current circuitry (l1A,l1B) is coupled to symmetrically bias the first (Q1 or Q3) and second (Q2 or Q4) transistors. In the described embodiments, the first separator transistor (J3) is a junction field effect transistor (JFET). In one embodiment, the first (Q1) and second (Q2) transistors are first and second NPN input transistors, and wherein the first, second, and third electrodes of the first (Q1) and second (Q2) transistors are bases, emitters, and collectors, respectively, wherein the first one of the first and second electrodes of the first transistor (Q1) is its base and the first one of the first and second electrodes of the second transistor (Q2) is its base, and wherein the second one of the first and second electrodes of the first transistor (Q1) is its emitter and the second one of the first and second electrodes of the second transistor (Q2) is its emitter.

In another embodiment, the first (Q3) and second (Q4) transistors are first and second PNP input transistors, and wherein the first, second, and third electrodes of the first (Q3) and second (Q4) transistors are bases, emitters, and collectors, respectively, wherein the first one of the first and second electrodes of the first transistor (Q3) is its emitter and the first one of the first and second electrodes of the second transistor (Q4) is its emitter, and wherein the second one of the first and second electrodes of the first transistor (Q3) is its base and the second one of the first and second electrodes of the second transistor (Q4) is its base. In another embodiment, the first (Q3) and second (Q4) transistors are first and second PNP input transistors, and wherein the first, second, and third electrodes of the first (Q3) and second (Q4) transistors are bases, emitters, and collectors, respectively, wherein the first one of the first and second electrodes of the first transistor (Q3) is its emitter and the first one of the first and second electrodes of the second transistor (Q4) is its emitter, and wherein the second one of the first and second electrodes of the first transistor (Q3) is its base and the second one of the first and second electrodes of the second transistor (Q4) is its base, the input stage (10C) including first (J1) and second (J2) field effect transistors each having a gate, a source, and a drain, the gates of the first (J1) and second (J2) field effect transistors being coupled to receive the first (Vin+) and second (Vin−) input signals, respectively, the first (Vin++) and second (Vin−−) signals being produced on the sources of the first (J1) and second (J2) field effect transistors in response to the first (Vin+) and second (Vin−) input signals, respectively, the sources of the first (J1) and second (J2) field effect transistors being coupled to the emitters of the first (Q3) and second (Q4) PNP transistors, respectively.

In one embodiment, the bias current circuitry includes a first current source (I1A) coupled to a source of the first separator transistor (J3) and a second current source (I1B) coupled to a drain of the first separator transistor (J3).

In one embodiment, load circuitry including a diode-connected third transistor (Q5) having a base and a collector is coupled to the third electrode of the first transistor (Q1 or Q3) and a fourth transistor (Q6) having a base connected to the base of the third transistor (Q5) and a collector is coupled to the third electrode of the second transistor (Q2 or Q4).

In one embodiment, the bias current circuitry includes a first current source (I1A);
a first diode-connected transistor (Q3B) having an emitter and a base coupled to an emitter and a base, respectively, of the first transistor (Q1 or Q3) and a collector coupled to the first current source (I1A) a second current source (I1B); and a second diode-connected transistor (Q4B) having an emitter and a base coupled to an emitter and a base, respectively, of the second transistor (Q2 or Q4), and a collector coupled to the second current source (I1B). The control circuit (11) includes selector circuitry (Q15,Q16,D1,D2) for detecting which of the first one of the first and second electrodes of the first transistor (Q1 or Q3) and the first one of the first and second electrodes of the second input transistor (Q2 or Q4) has a lower magnitude voltage and causing the output of the control circuit (11) to track the lower magnitude voltage. In one embodiment, the control circuitry (11A) includes a second separator transistor (J4), wherein the gate of the first separator transistor (J3) is coupled to the first one of the first and second electrodes of the first transistor (Q1 or Q3) by means of a first emitter follower including a first emitter-follower transistor (Q15) having a base coupled to the first one of the first and second electrodes of the first transistor (Q1 or Q3) and an emitter coupled to the gate of the first separator transistor (J3), and wherein a gate of the second separator transistor (J4) is coupled to the first one of the first and second electrodes of the second transistor (Q2 or Q4) by means of a second emitter follower including a second emitter-follower transistor (Q16) having a base coupled to the first one of the first and second electrodes of the second transistor (Q2 or Q4) and an emitter coupled to the gate of the second separator transistor (J4). A first diode-connected transistor (Q3B) is coupled to the first current source (I1A) by means of the first separator transistor (J3) and a base of a second diode-connected transistor (Q4B) is coupled to the second current source (I1B) by means of the second separator transistor (J4).

In one embodiment, the control circuitry (11B) includes a second separator transistor (J4), wherein the gate of the first separator transistor (J3) is coupled to the first one of the first and second electrodes of the first transistor (Q1 or Q3) by means of a first emitter follower including a first emitter-follower transistor (Q15) having a base coupled to the first one of the first and second electrodes of the first transistor (Q1 or Q3) and an emitter coupled to the gate of the first separator transistor (J3), and wherein a gate of the second separator transistor (J4) is coupled to the first one of the first and second electrodes of the second transistor (Q2 or Q4) by means of a second emitter follower including a second emitter-follower transistor (Q16) having a base coupled to the source of the second input transistor (J2) and an emitter coupled to the gate of the second separator transistor (J4). The bias current circuitry includes a current source (I1), and wherein a base of a first diode-connected transistor (Q3B) is coupled to the current source (I1) by means of the first separator transistor (J3) and a base of a second diode-connected transistor (Q4B) is coupled to the current source (I1) by means of the second separator transistor (J4).

In one embodiment, the selector circuitry includes a first diode (D1) having a cathode coupled to the source of the first input transistor (J1) and a second diode (D2) having a cathode coupled to the source of the second input transistor (J2), anodes of the first and second diodes being coupled to a current source (I7) and to the gate of the first separator transistor (J3). The cathode of the first diode (D1) is coupled to the first one of the first and second electrodes of the first transistor (Q1 or Q3) by means of a first emitter follower including a first emitter-follower transistor (Q15) having a base coupled to the first one of the first and second electrodes of the first transistor (Q1 or Q3) and an emitter coupled to the cathode of the first diode (D1), and wherein the cathode of the second diode (D2) is coupled to the first one of the first and second electrodes of the second transistor (Q2 or Q4) by means of a second emitter follower including a second emitter-follower transistor (Q16) having a base coupled to the first one of the first and second electrodes of the second transistor (Q2 or Q4) and an emitter coupled to the cathode of the second diode (D2).

In one embodiment, the control circuit (11) includes a level shift circuit including a level shift transistor (Q7) having a base coupled to the anodes of the first (D1) and second (D2) diodes and an emitter coupled to the gate of the first separator transistor (J3).

BRIEF DESCRIPTION OF THE DRAWINGS

FIG. 4B is a simplified schematic diagram of another operational amplifier input stage according to the present invention.

FIG. 4C is a simplified schematic diagram of yet another operational amplifier input stage according to the present invention.

DETAILED DESCRIPTION OF THE PREFERRED EMBODIMENTS

Figure 4A:
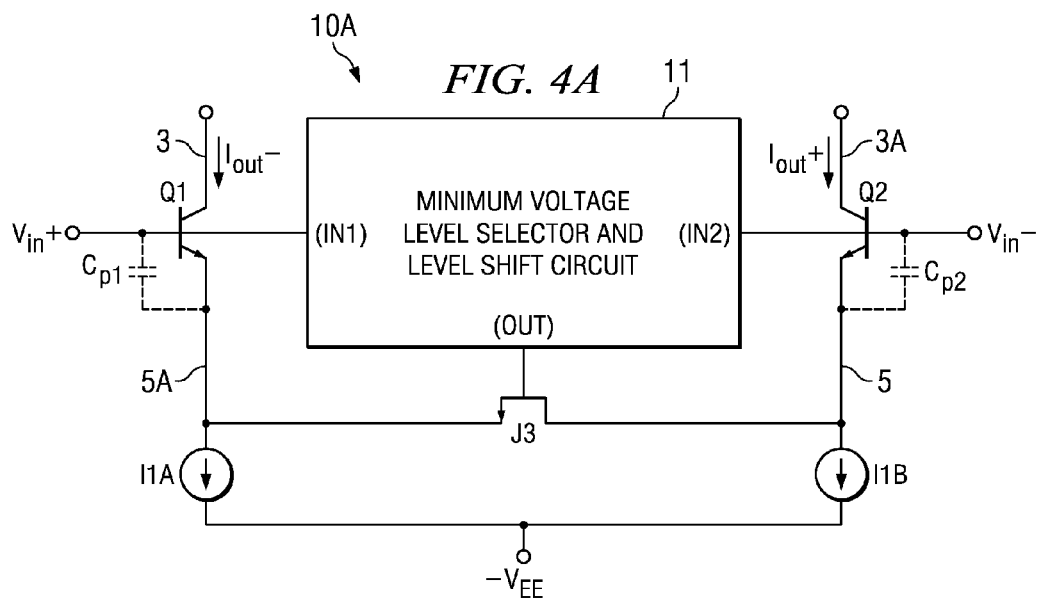
FIG. 4A is a simplified schematic diagram of an operational amplifier input stage according to the present invention.

FIG. 4A shows part of an input stage 10A which includes NPN input transistors Q1 and Q2 having their collectors connected to conductors 3 and 3A, respectively. The bases of input transistors Q1 and Q2 are connected to the input signals Vin+ and Vin−, respectively. The collector current of input transistor Q1 is Iout− and the collector current of input transistor Q2 is Iout+. The emitter of input transistor Q1 is connected by conductor 5A to one terminal of a current source I1A, the other terminal of which is connected to −VEE. The emitter of input transistor Q2 is connected by conductor 5 to one terminal of a current source I1B, the other terminal of which is connected to −VEE. Conductors 3A and 3 can be connected to a suitable load circuit, such as current mirror or folded cascode stage. Parasitic base-emitter capacitance Cp1 of input transistor Q1 is in effect coupled between Vin+ and conductor 5A, and similarly, parasitic base-emitter capacitance Cp2 of input transistor Q2 is in effect coupled between Vin− and conductor 5.

A "minimum voltage level selector and level shift circuit" 11 has one input IN1 connected to the base of input transistor Q1 and Vin+, another input IN2 connected to the base of input transistor Q2 and Vin−, and an output OUT connected to the gate of a N-channel JFET "separator" transistor J3. The source of separator transistor J3 is connected to conductor 5A, and the drain of separator transistor J3 is connected to conductor 5.

Referring to FIG. 4A, when amplifier 10B is in a balanced condition transistor J3 is in its triode mode because its gate voltage is approximately equal to its source and drain voltages. When, for example, the Vin+ voltage increases to a high level while Vin− remains constant, the output of minimum voltage level selector and level shift circuit 11 remains constant because it selects and tracks the minimum voltage level of the two input signals Vin+ and Vin−, which in this case is the voltage level of Vin−. The voltage of conductor 5A tracks Vin+ and therefore increases, and the voltage of conductor 5 tracks the voltage of conductor 5A until pinch-off of separator transistor J3 occurs. Therefore the voltage on conductor 5 increases only about 1 to 2 volts (which is the pinch-off voltage Vp of N-channel separator JFET J3 if the current I1B is much lower than the $I_{DSS}$ current of separator transistor J3). Consequently, in the imbalanced condition the current of current source I1A continues flowing through input transistor Q1, separator transistor J3 switches from its triode mode to its saturation mode, and the current I1B switches from input transistor Q2 to separator transistor J3 and is summed with the current I1A so that input transistor Q1 conducts a doubled amount of current and input transistor Q2 is off. The emitter voltages of input transistors Q1 and Q2 are no longer equal to each other (as in a simple differential amplifier); instead, they are in a sense isolated from each other and differ by the source-drain voltage of separator transistor J3, which is nearly equal to the input differential voltage Vin+−Vin−.

FIG. 4B shows part of an input stage 10B which includes PNP input transistors Q3 and Q4 having their emitters coupled to Vin+ and Vin−, respectively. The collectors of input transistors Q3 and Q4 are connected to conductors 3A and 3, respectively. Conductors 3A and 3 can be connected to a suitable load circuit, such as current mirror or folded cascode stage. The collector current of input transistor Q4 is Iout− and the collector current of input transistor Q3 is Iout+. The bases of input transistors Q3 and Q4 are connected to conductors 5A and 5, respectively. Parasitic base-emitter capacitance Cp1 of input transistor Q3 is in effect coupled between Vin+ and conductor 5A, and similarly, parasitic base-emitter capacitance Cp2 of input transistor Q4 is in effect coupled between Vin− and conductor 5. The base of input transistor Q3 is connected by conductor 5A to one terminal of current source I1A, the other terminal of which is connected to −VEE. The base of input transistor Q4 is connected by conductor 5 to one terminal of a current source I1B, the other terminal of which is connected to −VEE. Vin+ also is connected to the input IN1 of minimum voltage level selector and level shift circuit 11. Vin− also is connected to the input IN1 of minimum voltage level selector and level shift circuit 11, the output of which is connected to the gate of-channel JFET separator transistor J3. The source of separator transistor J3 is connected by conductor 5A to the base of input transistor Q3, and the drain of separator transistor J3 is connected by conductor 5 to the base of input transistor Q4.

Still referring to FIG. 4B, when amplifier 10B is in a balanced condition transistor J3 is in its triode mode because its gate voltage is set approximately equal to its source and drain voltages. When the Vin+ voltage increases and Vin− remains constant, the output of minimum voltage level selector and level shift circuit 11 remains constant because it selects and tracks the minimum of the two voltage levels of Vin+ and Vin−, which in this case is the voltage level of Vin−. The voltage of conductor 5A tracks Vin+ and therefore increases, and the voltage of conductor 5 tracks the voltage of conductor 5A until pinch-off of separator transistor J3 occurs. Therefore, the voltage on conductor 5 increases only about 1 to 2 volts (which is the pinch-off voltage Vp of separator transistor J3 if the bias current I1B is much lower than the $I_{DSS}$ current of separator transistor J3). Consequently, in the imbalanced condition, the current I1A continues flowing through the base of input transistor Q3, separator transistor J3 switches from its triode mode to its saturation mode, and the bias current I1B switches from the base of input transistor Q4 to separator transistor J3 and is summed with the bias current I1A so the base current of input transistor Q3 is doubled and input transistor Q4 is off.

The base voltages of input transistors Q3 and Q4 are no longer equal to each other (as in a typical current input differential amplifier) and instead are isolated or separated by separator transistor J3, which absorbs almost all the input differential voltage. In practice, the current gain (Beta) of input transistors Q3 and Q4 is reduced by additional forward biased diodes connected in parallel with their emitter-base junctions, thus forming a current mirror circuit where the current gain is determined by a transistor/diode area ratio, as shown in subsequently described FIG. 5.

Figure 3:
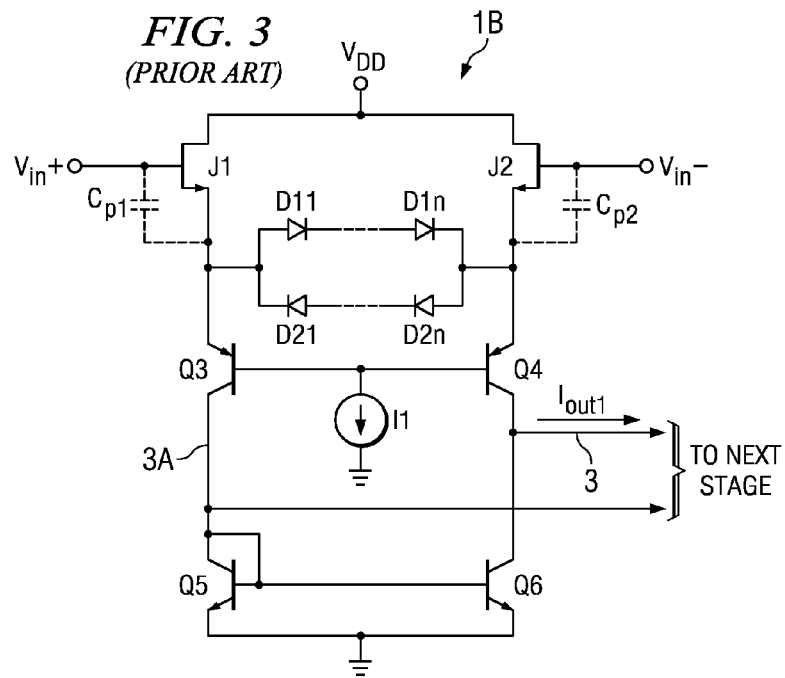
FIG. 3 is a generalized schematic diagram of a typical input stage and clamp circuit used in operational amplifiers of the general type shown in FIG. 2.

FIG. 4C shows part of an input stage 10C which includes N-channel JFET (Junction field effect transistor) input transistors J1 and J2 having their drains connected to VDD. The gates of input transistors J1 and J2 are connected to input signals Vin+ and Vin−, respectively. The source of input transistor J1 is connected by conductor 4A to the emitter of PNP transistor Q3, and the source of input transistor J2 is connected by conductor 4 to the emitter of PNP transistor Q4. Vin++ and Vin−− can be considered to be input voltages which follow the input signals Vin+ and Vin−, respectively. The collectors of transistors Q3 and Q4 are connected to conductors 3A and 3, respectively. Conductors 3A and 3 can be connected to the input and output, respectively, of a current mirror (such as current mirror Q5 and Q6 as shown in FIG. 3). Parasitic gate-source capacitance Cp1 of input transistor J1 is in effect coupled between Vin+ and conductor 4A, and similarly, parasitic gate-source capacitance Cp2 of input transistor J2 is in effect coupled between Vin− and conductor 4.

Minimum voltage level selector and level shift circuit 11 has its input IN1 connected by conductor 4A to the source of input transistor J1, its input IN2 connected by conductor 4 to the source of input transistor J2, and an output connected to the gate of-channel JFET separator transistor J3. The source of separator transistor J3 is connected to the base of transistor Q3 and the drain of separator transistor J3 is connected to the base of transistor Q4. A bias current source I1A is connected by conductor 5A to the source of separator transistor J3 and another bias current source I1B is connected by conductor 5 to the drain of separator transistor Q4. (It should be noted that the schematic drawing of the input stage in FIG. 4C does not show some additional devices (which could be readily provided by those skilled in the art in the manner generally shown in subsequently described FIG. 5) for limiting the current gain of transistors Q3 and Q4 to a lower value of A1 and thus setting the DC tail current of the input stage to I1*A1. This I1*A1 value of DC tail current sets the maximum value of the output current Iout1 which charges the Miller compensation capacitor, for example Ccomp shown in Prior Art FIG. 2.)

Thus, although input stage 10C of FIG. 4C is somewhat similar to the input stage 1B of FIG. 3, the left side J1,Q3 and of the right side J2,Q4 of FIG. 4C are not directly connected via the bases of transistors Q3 and Q4 as in Prior Art FIG. 3. Instead, in FIG. 4C separator transistor J3 is coupled by conductors 5A and 5 between the bases of transistors Q3 and Q4. Also, the diode clamp circuit including diodes D11 . . . D1n and D21 . . . D2n of Prior Art FIG. 3 is omitted from FIG. 4C, and instead the minimum voltage level selector and level shift circuit 11 is coupled between the sources of input transistors J1 and J2. The output of minimum voltage level selector circuit 11 controls the gate of transistor J3.

Since the left side J1,Q3 and right side J2,Q4 of the input stage are isolated or separated by separator transistor J3, the left and right sides must be biased separately in order to preserve circuit symmetry and zero offset voltage between the left and right sides. That is, bias current source I1A is connected by conductor 5A to the base of transistor Q3, and similarly, bias current source I1B is connected by conductor 5 to the base of transistor Q4. (Note that the each current-carrying electrode of a JFET can be either a source or a drain, depending on its voltage relative to the other current-carrying electrode.)

If the differential input signal Vin=Vin+-Vin− is relatively large, for example during slewing of an operational amplifier that includes any of input stages 10A-10C, the configurations shown in FIGS. 4A-4C provide a way to separate the left side J1,Q3 and right side J2,Q4 such that separator transistor J3 absorbs most of the differential input voltage Vin+-Vin− (or Vin++-Vin−− in FIG. 4C) and thereby limits the reverse bias voltages across the base-emitter junctions of transistor Q3 or Q4 in FIG. 4C (or across the emitter-base junctions of input transistors Q3 and Q4 in FIG. 4B, or across the emitter-base junctions of input transistors Q1 and Q2 in FIG. 4A).

Therefore, the voltage difference between the base voltages of transistors Q3 and Q4 in FIG. 4B, and also the voltage difference between the source voltages Vin++ and Vin−− of input transistors J1 and J2 in FIG. 4C, can be as high as the value of a typical power supply voltage VDD.

Next, a detailed explanation of the operation of input stage 10C in FIG. 4C is provided. In a balanced state, both the left side J1,Q3 and right side J2,Q4 conduct the same amount of current and produce the same voltages on corresponding symmetrical nodes. In the balanced state, the output of minimum voltage level selector and level shift circuit 11 should be as close as possible to the base voltages of transistors Q3 and Q4. In this condition, transistor J3 is in its "triode" region and functions like a small value resistor. The gate-to-source voltage $V_{GS}$ of separator transistor J3 is set to approximately 0 volts, which means the drain-to-source resistance $R_{DS}$ is at its minimum value, which is important in order to minimize the noise contribution of separator transistor J3 and its size and parasitic capacitance.

When the Vin+ input voltage increases and the Vin− input voltage remains constant, the voltages at conductors 4A and 4 track the corresponding voltage inputs with a level shift equal to VGS, the output of minimum voltage level selector and level shift circuit 11 remains constant because it selects and tracks the minimum of the two voltage levels of Vin+ and Vin−, which in this case is the voltage level of Vin . The voltage of conductor 5A tracks Vin+ and therefore increases, and the voltage of conductor 5 tracks the voltage of conductor 5A until pinch-off of separator transistor J3 occurs. Therefore, the voltage on conductor 5 increases only about 1 to 2 volts (which is the pinch-off voltage Vp of separator transistor J3 if the bias current I1B is much lower than the IDSS current of separator transistor J3). Consequently, in the imbalanced condition, the current I1A continues flowing through the base of input transistor Q3. Separator transistor J3 switches from triode mode to saturation mode, and the bias current I1B switches from the base of input transistor Q4 to separator transistor J3 and is summed with the bias current I1A so the base current of input transistor Q3 is doubled, as well as emitter current of transistor Q3 and the current of transistor J1, while input transistor Q4 and transistor J2 are off. The base voltages of input transistors Q3 and Q4 are no longer equal to each other; instead they are separated by separator transistor J3, which absorbs almost all the input differential voltage. In practice, the current gain (Beta) of transistors Q3 and Q4 is reduced by additional forward biased diodes connected in parallel with their emitter-base junctions, thus forming a current mirror circuit where the current gain is determined by a transistor/diode area ratio, as shown in subsequently described FIG. 5.

Since the gate voltage of separator transistor J3 is initially the same as the base voltage of transistor Q4 in FIG. 4C, when the source voltage of separator transistor J3 rises by the pinch-off voltage Vp, the emitter-base junction of transistor Q4 will be reverse biased by Vp−VBE volts (Vp and VBE being the pinch-off voltage and base-emitter voltage of separator transistor J3 and of transistor Q4, respectively). A typical value of the pinch-off voltage Vp is between 1 and 3 volts and VBE is approximately 0.7 volts. Therefore, the base-emitter junction of transistor Q4 is reverse biased by less than 3 volts, which is well within the safe operating area of most bipolar integrated circuit transistors. Consequently, as long as the drain-to-source breakdown voltage of transistor J3 is at least as high as the maximum supply voltage VDD, the differential stages 10A-10C in FIGS. 4A-4C, respectively, are always in their safe operating conditions.

As a result of the separation provided by separator transistor J3, under large differential input voltage conditions, the gate-to-source junction of input transistor J2 in FIG. 4C remains reverse biased by only the pinch-off voltage. Therefore, the junction parasitic capacitance Cp1 or Cp2 does not get charged to a high voltage level, which is the case when the diode clamp protection shown in Prior Art FIG. 3 is used. Since the parasitic junction capacitance Cp1 or Cp2 is not highly precharged, the input stages 10A-10C of FIGS. 4A-4C, respectively, do not generate slew-altering parasitic currents, and there is no large recharging current at the input gate node which induces transient error resulting from the reaction of recharging current with the source or emitter impedances of the input transistors.

In the positive direction slewing mode of an operational amplifier, the output of minimum voltage level selector and level shift circuit 11 will track the source voltage (conductor 4) of input transistor J2 of FIG. 4C, which is the lower of the source voltages of input transistors J1 and J2. The base-emitter junction of transistor Q4 is always reverse biased by a constant voltage equal to Vp-VBE.

There is also a possibility of using lower voltage JFET devices in input stage 10C. For example, assume the breakdown voltage of JFETs J1, J2 and J3 is 20 volts and the power supply voltages are +15 volts and −15 volts. If the input voltage Vin+ is equal to +15 volts and the input voltage Vin− is equal to −15 volts, then almost 30 volts would be applied across separator transistor J3, which exceeds its breakdown voltage. As a result, the gate and source voltages of J3 are no longer set by minimum voltage level selector circuit 11 and are simply equal to its drain voltage (which is almost 15 volts) minus the JFET breakdown voltage of 20 volts. This overrides minimum voltage level selector circuit 11, resulting in negative 5 volts at the source and gate of separator transistor J3. Therefore, there is only 10 volts across the source-gate junction of input transistor J2 and it is in a safe operating mode. At the same time, a safe breakdown mode of operating separator transistor J3 can be provided by limiting the amount of current flowing through the junctions of separator transistor J3 to a safe low level. This current is determined by minimum voltage level selector circuit 11. Also, the emitter-base junctions of transistors Q3 and Q4 should be individually protected from large reverse bias voltage using diode clamps if the VGS voltage of separator transistor J3 is not well determined. In this way, input stage 10C reduces the maximum voltage across the gate-source junction of input transistors J1 and J2, making possible the use of high performance but low-breakdown-voltage JFET transistors while still providing high (equal to the full supply voltage) absolute maximum values of the differential input voltage Vin+-Vin−.

Another possibility provided by input stage 10C is to use low voltage high performance JFETs for the input transistor pair J1 and J2 while using a high voltage lower performance JFET for the separator transistor J3, as the maximum gate-to-source voltage of transistors J1 and J2 in this circuit is below Vp, and separator transistor J3 "absorbs" almost all the input differential voltage.

Because of the left/right symmetry of the input stages 10A-10C of FIGS. 4A-4C, respectively, the explanations of operation are substantially similar for the "slewing down" mode of operational amplifiers including those input stages, respectively.

Figure 2:
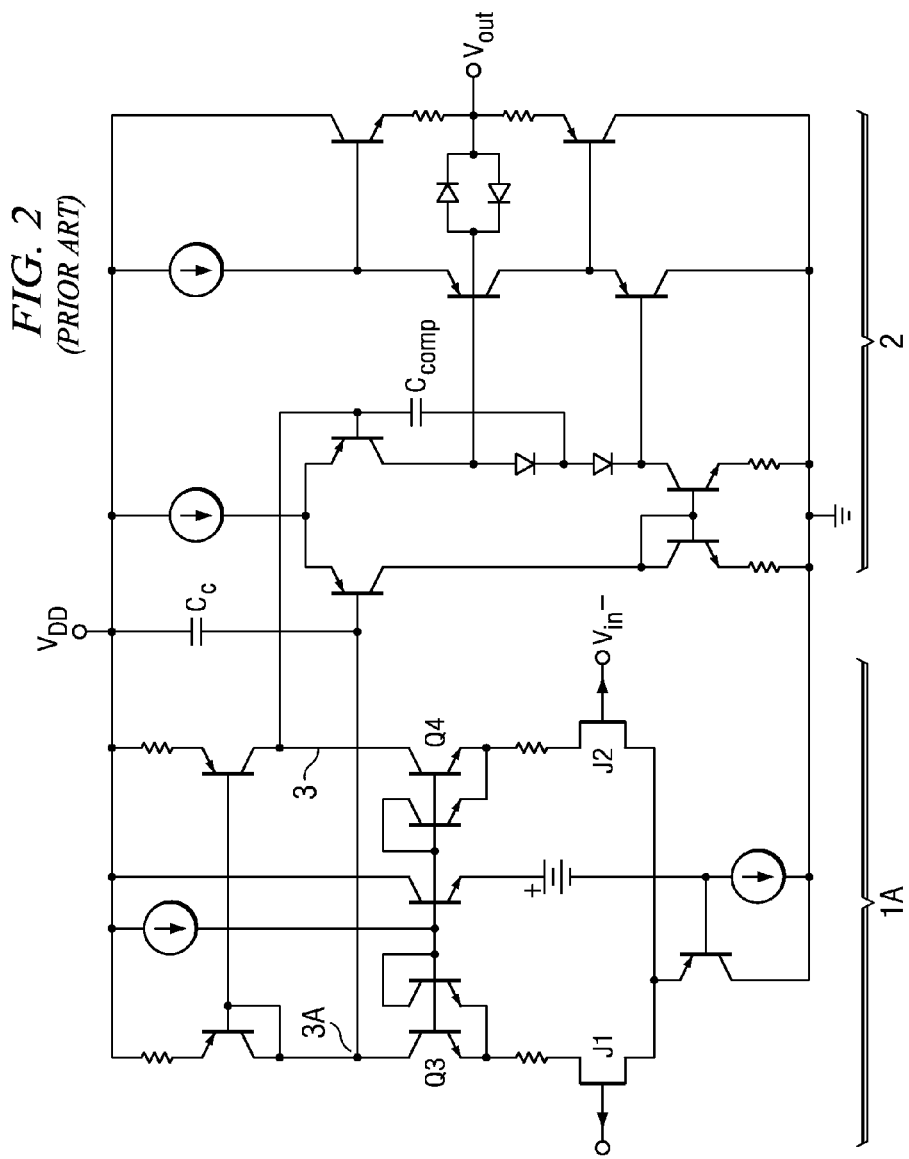
FIG. 2 is a schematic diagram of a prior art operational amplifier.
Figure 1:
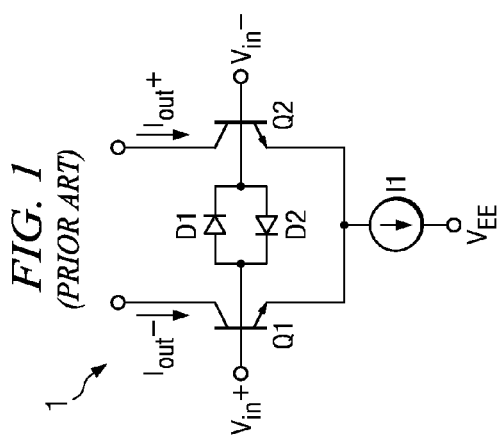
FIG. 1 is a is a schematic diagram of the input stage of a prior art operational amplifier.

It should be noted that the input stages 10A-10C of FIG. 4A-4C can be used with various conventional output stages, including the output stage 2 shown in Prior Art FIG. 2.

The above described input stages 10A-10C provides solutions to the above described problems of protecting the emitter-based junctions of certain transistors therein.

Thus, the input circuits 10A-10C shown in FIGS. 4A-4C, respectively, protect the emitter-base (gate-source) junctions of the transistors as explained above during large magnitudes of the differential input voltage Vin, and accomplishes this without altering the slew rates of an operational amplifier including any of the input stages 10A-10C.

Figure 5:
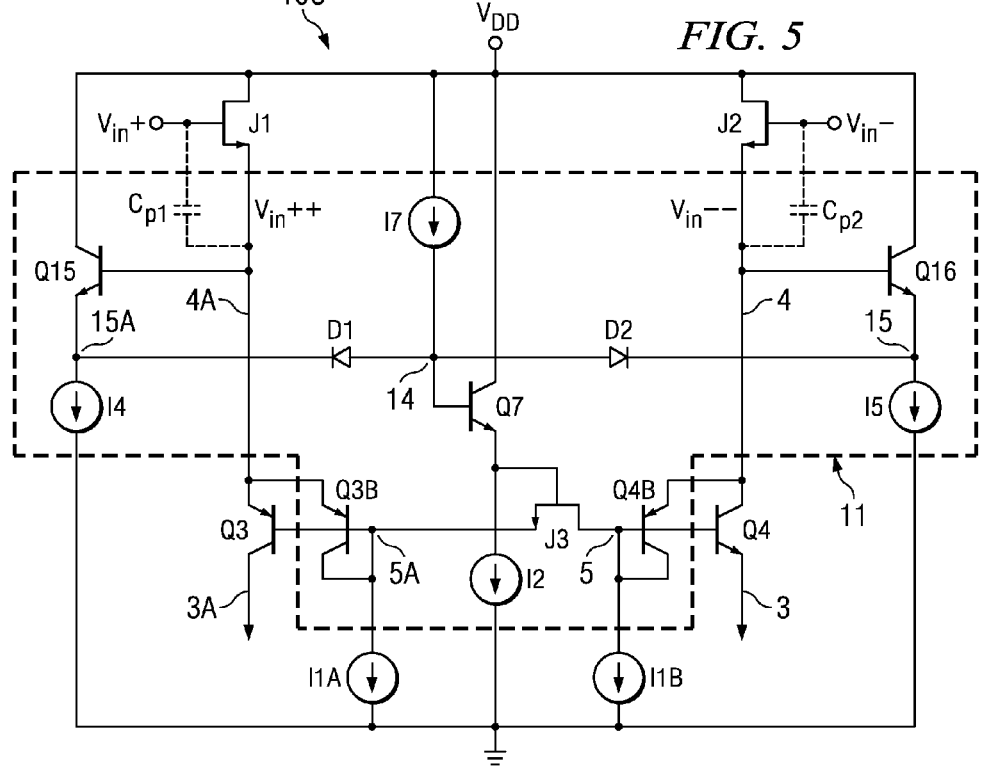
FIG. 5 is a schematic diagram of one implementation of the input circuit of FIG. 4C.

The circuit shown in FIG. 5 provides an example of one way in which minimum voltage level selector and level shift circuit 11 of FIG. 4C can be implemented to control separator transistor J3. As in FIG. 4C, the input transistor pair includes JFETs J1 and J2, the sources of which are "followed" by the emitters of transistors Q3 and Q4. The bias current source I1A is connected by conductor 5A to the base of transistor Q3 and the source of separator transistor J3, and bias current source I1B is connected by conductor 5 to the base of transistor Q4 and the drain of separator transistor J3. Minimum voltage level selector and level shift circuit 11 includes separator transistor J3, as in FIG. 4C. Minimum voltage level selector and level shift circuit 11 also includes a NPN transistor Q15 having its collector connected to VDD, its base connected to conductor 4A, and its emitter connected by conductor 15A to one terminal of a current source I4 and to the cathode of a diode D1. Similarly, a NPN transistor Q16 having its collector connected to VDD, its base connected to conductor 4, and its emitter connected by conductor 15 to one terminal of a current source I5 and to the cathode of a diode D2. Transistors Q15 and Q16 are biased by current sources 14 and 15, respectively. The anodes of diodes D1 and D2 are connected by conductor 14 to one terminal of a current source 17 and to the base of a NPN level shifting transistor Q7 having its collector connected to VDD and its emitter connected to the gate of separator transistor J3 and to one terminal of a current source 12. Diodes D1 and D2 which are biased by current source 17, level shift transistor Q7 is biased by current source 12.

A diode-connected PNP transistor Q3B has its emitter connected to conductor 4A and its base and collector connected to conductor 5A. Similarly, a diode-connected PNP transistor Q4B has its emitter connected to conductor 4 and its base and collector connected to conductor 5. Current sources I1A and I1B also bias the diode-connected transistors Q3B and Q4B, respectively. Transistors Q3 and Q3B form a current mirror, and transistors Q4 and Q4B formed another current mirror, whereby transistor Q3B sets the bias of transistor Q3, while transistor Q4B biases transistor Q4.

Together, current sources I1A and I1B form a tail current source for the differentially coupled input transistors J1 and J2.

Under steady-state conditions, both sides of input stage 10C in FIG. 5 are balanced and the source voltages of input transistors J1 and J2 are a VGS voltage higher than their respective gate voltage. The base voltage of transistors Q3 and Q4 is about 0.7 volts lower than the source voltage of either input transistor J1 or J2. Current from current source 17 splits equally through diodes D1 and D2. Consequently, the anodes (conductor 14) of diodes D1 and D2 are at approximately the source voltages of input transistors J1 and J2. As previously mentioned, the gate of separator transistor J3 needs to be equal to approximately the base voltages of transistors Q3 and Q4 in order to minimize the channel resistance $R_{DS}$ of separator transistor J3. To accomplish this, a voltage level shift is required, and is provided by transistor Q7 and current source I2.

When Vin+ rises, the source voltage (Vin++ on conductor 4A) of input transistor J1 and the emitter voltage (conductor 15A) of transistor Q15 track input signal Vin+ with the corresponding voltage shifts. Meanwhile, the emitter of transistor Q16 tracks the inverting input signal Vin− and the signal Vin−− on the source of input transistor G2 and therefore remains at a relatively low voltage. The cathode of diode D1 then receives a relatively high voltage while the cathode of diode D2 receives a relatively low voltage. In this case, diode D2 turns on, with its anode (conductor 14) approximately 0.7 volts above its cathode, and conducts a essentially all of current 17, while diode D1 is reverse biased and conducts only a negligible amount of reverse-bias leakage current. It should be noted that the currents I5 (and I4) need to be larger than 17 to ensure that transistors Q16 and transistor Q15 never turn off. At this point, the gate of separator transistor J3 tracks the inverting input signal Vin− through transistor Q16, diode D2 and Q7. The right node conductor 5 of separator transistor J3 is approximately Vp volts higher than its gate, and also remains at a low voltage, in this case functioning as the source of separator transistor J3. The left node 5A of separator transistor J3 tracks the non-inverting input Vin+ and is at a high voltage level, in this case functioning as the drain of separator transistor J3. The non-inverting and inverting sides of the input transistor pair J1,J2 are separated, and transistor Q4, and also transistor Q4B, are protected from large reverse-bias base-emitter junction voltages.

A similar explanation can be provided to describe what happens when Vin− decreases. The anode of diode D1 stays low (as diode D1 turns on and conducts the current I7) while diode D2 is reverse biased. The gate of separator transistor J3 tracks the non-inverting input signal Vin+, which is lower than Vin+. The left node (conductor 5A of separator transistor J3 is approximately Vp volts higher than its gate voltage while the right node (conductor 5) of separator transistor J3 tracks the inverting input signal Vin−. Again, the non-inverting and inverting sides of the input transistor pair J1,J2 are separated and transistor Q3 and diode-connected transistor Q3B are protected from large emitter-base junction reverse bias voltages.

Figure 6:
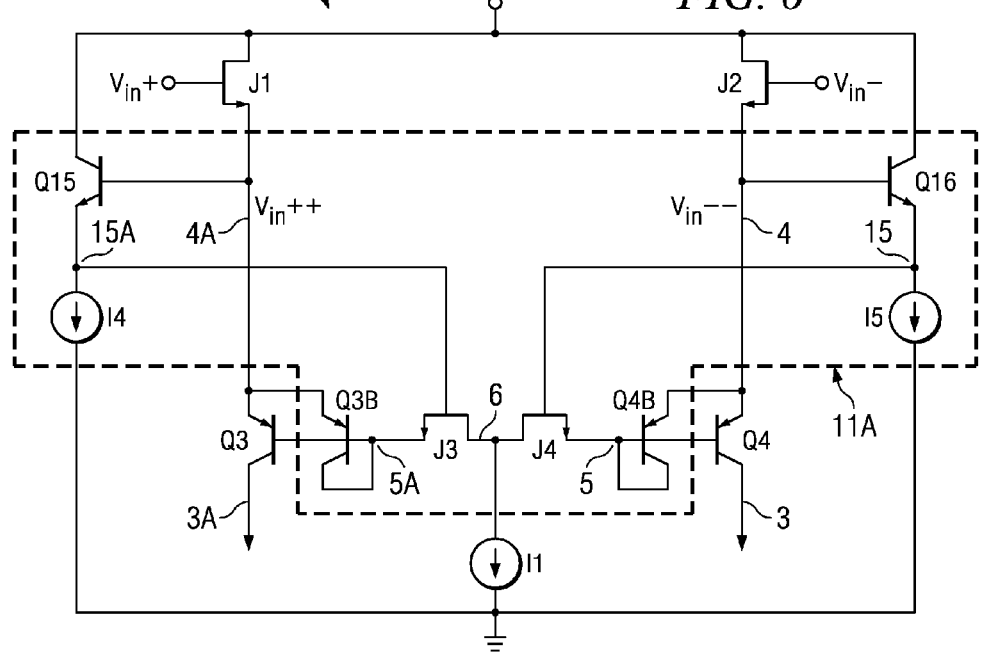
FIG. 6 is a schematic diagram of another implementation of the minimum voltage level selector and level shift circuit included in FIGS. 4A-4C.

Another possible implementation of minimum voltage level selector and level shift circuit 11 as shown in FIG. 5 is shown in input stage 10D of FIG. 6, as minimum voltage level selector and level shift circuit 11A. In FIG. 6, separator transistor J3 of FIG. 5 can be thought of as being split into two separator transistors J3 and J4 while bias current sources I1A and I1B of FIG. 5 can be thought of as being combined into a single bias current source I1 which is connected to the middle junction 6 between separator transistors J3 and J4.

This allows separator transistors J3 and J4 to be controlled separately, so diodes D1 and D2 of FIG. 5 are no longer needed. In this configuration, the minimum selector function is performed by JFETs J3 and J4 themselves. Also, in input stage 10D of FIG. 6, the voltage level shift of transistor Q7 is not required so the gate of separator transistor J3 is connected directly to the emitter of transistor Q15 and the gate of separator transistor J4 is connected directly to the emitter of transistor Q16. Note that under balanced, steady-state conditions, half of the current I1 flows through separator transistor J3 and the other half flows through the other separator transistor J4. Because of this, separator transistors J3 and J4 may contribute flicker noise, but, the current I1 is a common-mode source and therefore does not actually contribute any noise.

Figure 7:
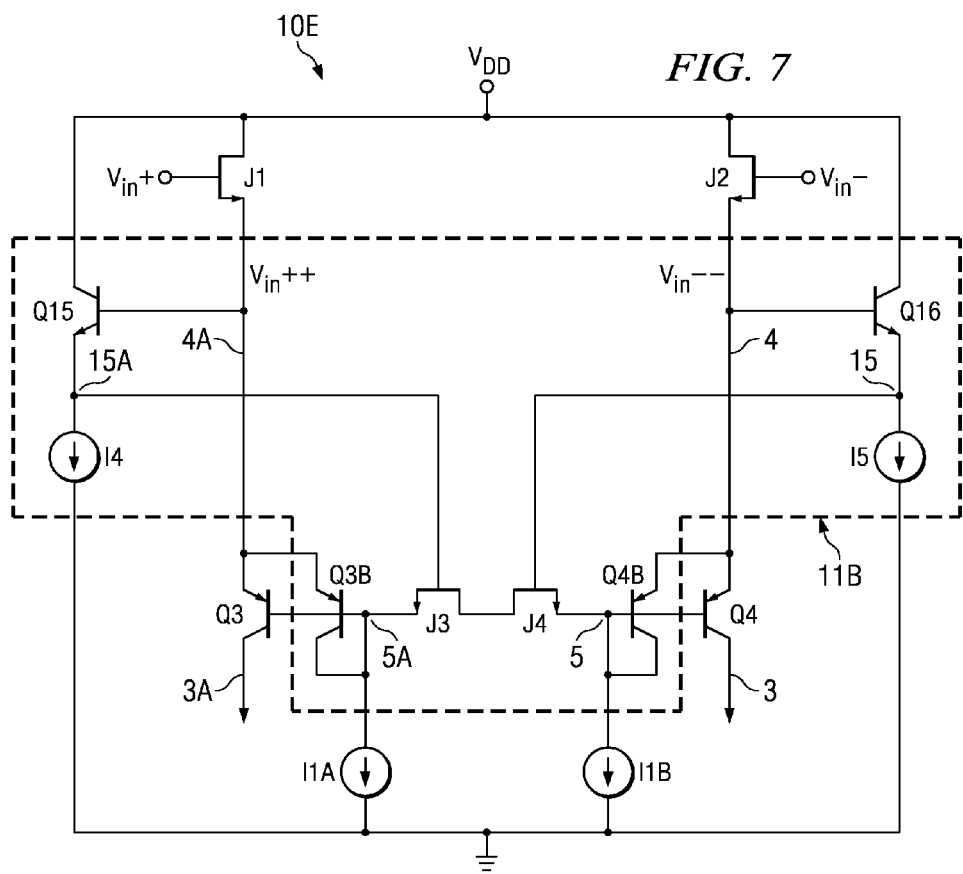
FIG. 7 is a schematic diagram of another implementation of the minimum voltage level selector and level shift circuit included in FIGS. 4A-4C.

FIG. 7 shows another input stage in which separator transistor J3 of FIG. 5 is split into two separator transistors J3 and J4, while using both of bias current sources I1A and I1B and diode-connected transistors Q3B and Q4B. Unlike input circuit 10D of FIG. 6, there is no large current flowing through separator transistors J3 and J4 under steady-state conditions, and they do not contribute flicker noise. However, current sources I1A and I1B are noise generators because they are not common-mode sources. Fortunately, there are various design techniques that can be used to minimize the noise contribution of these current sources, such as emitter/source degeneration or use of long-channel MOSFETs for the purpose of reducing flicker noise.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, although the described embodiments are operational amplifiers, the invention is generally applicable to other kinds of differential amplifiers. For example, the various described minimum voltage level selector circuits can be readily adapted for use in conjunction with any of the described input stages.

What is claimed is:

1. Amplifier circuitry including an input stage, the input stage comprising:
  (a) first and second transistors, each having first, second, and third electrodes, a first one of the first and second electrodes of the first transistor being coupled to receive a first signal, and a first one of the first and second electrodes of the second transistor being coupled to receive a second signal;
  (b) a first separator transistor having a first current-carrying electrode coupled to the second one of the first and second electrodes of the first transistor and a second current-carrying electrode coupled to the second one of the first and second electrodes of the second transistor;
  (c) a control circuit having a first input coupled to the first one of the first and second electrodes of the first transistor, a second input coupled to the first one of the first and second electrodes of the second transistor, and an output coupled to a gate of the first separator transistor for controlling the first separator transistor in response to the first and second signals so as to limit a reverse bias voltage across a PN junction of one of the first and second transistors; and (d) bias current circuitry coupled to bias the first and second transistors, respectively.

2. The amplifier circuitry of claim 1, wherein the first and second transistors are first and second NPN input transistors; wherein the first, second, and third electrodes of the first and second transistors are bases, emitters, and collectors, respectively; wherein the first one of the first and second electrodes of the first transistor is its base, and the first one of the first and second electrodes of the second transistor is its base; and wherein the second one of the first and second electrodes of the first transistor is its emitter, and the second one of the first and second electrodes of the second transistor is its emitter.

3. The amplifier circuitry of claim 1, including an output stage.

4. The amplifier circuitry of claim 1, wherein the first and second transistors are first and second PNP input transistors, and wherein the first, second, and third electrodes of the first and second transistors are bases, emitters, and collectors, respectively; wherein the first one of the first and second electrodes of the first transistor is its emitter, and the first one of the first and second electrodes of the second transistor is its emitter; and wherein the second one of the first and second electrodes of the first transistor is its base, and the second one of the first and second electrodes of the second transistor is its base.

5. The amplifier circuitry of claim 1, wherein the first and second transistors are first and second PNP input transistors, and wherein the first, second, and third electrodes of the first and second transistors are bases, emitters, and collectors, respectively; wherein the first one of the first and second electrodes of the first transistor is its emitter, and the first one of the first and second electrodes of the second transistor is its emitter; and wherein the second one of the first and second electrodes of the first transistor is its base, and the second one of the first and second electrodes of the second transistor is its base; the input stage further including first and second field effect transistors each having a gate, a source, and a drain; the gates of the first and second field effect transistors being coupled to receive the first and second input signals, respectively; the first and second signals being produced on the sources of the first and second field effect transistors in response to the first and second input signals, respectively; and the sources of the first and second field effect transistors being coupled to the emitters of the first and second PNP transistors, respectively.

6. The amplifier circuitry of claim 5, wherein the first and second field effect transistors are N-channel junction field effect transistors.

7. The amplifier circuitry of claim 5, wherein the bias current circuitry includes a first current source coupled to a source of the first separator transistor, and a second current source coupled to a drain of the first separator transistor.

8. The amplifier circuitry of claim 5, wherein the selector circuitry includes a first diode having a cathode coupled to the source of the first field effect transistor, and a second diode having a cathode coupled to the source of the second field effect transistor; anodes of the first and second diodes being coupled to a current source and to a gate of the first separator transistor.

9. The amplifier circuitry of claim 8, wherein the cathode of the first diode is coupled to the first one of the first and second electrodes of the first transistor by means of a first emitter follower including a first emitter-follower transistor having a base coupled to the first one of the first and second electrodes of the first transistor and an emitter coupled to the cathode of the first diode; and wherein the cathode of the second diode is coupled to the first one of the first and second electrodes of the second transistor by means of a second emitter follower including a second emitter-follower transistor having a base coupled to the first one of the first and second electrodes of the second transistor and an emitter coupled to the cathode of the second diode.

10. The amplifier circuitry of claim 8, wherein the control circuit includes a level shift circuit including a level shift transistor having a base coupled to the anodes of the first and second diodes and an emitter coupled to the gate of the first separator transistor.

11. The amplifier circuitry of claim 1, wherein the first separator transistor is a junction field effect transistor (JFET).

12. The amplifier circuitry of claim 1, including load circuitry including a diode-connected third transistor having a base and a collector coupled to the third electrode of the first transistor, and a fourth transistor having a base connected to the base of the third transistor and a collector coupled to the third electrode of the second transistor.

13. The amplifier circuitry of claim 1, wherein the bias current circuitry includes a first current source; a first diode-connected transistor having an emitter and a base coupled to an emitter and a base, respectively, of the first transistor, and a collector coupled to the first current source; a second current source; and a second diode-connected transistor having an emitter and a base coupled to an emitter and a base, respectively, of the second transistor and a collector coupled to the second current source.

14. The amplifier circuitry of claim 13, wherein the control circuit includes selector circuitry for detecting which of the first one of the first and second electrodes of the first transistor and the first one of the first and second electrodes of the second input transistor has a lower magnitude voltage, and causing the output of the control circuit to track the lower magnitude voltage.

15. The amplifier circuitry of claim 14, wherein the control circuitry includes a second separator transistors; wherein a gate of the first separator transistor is coupled to the first one of the first and second electrodes of the first transistor by means of a first emitter follower including a first emitter-follower transistor having a base coupled to the first one of the first and second electrodes of the first transistor and an emitter coupled to the gate of the first separator transistor; and wherein a gate of the second separator transistor is coupled to the first one of the first and second electrodes of the second transistor by means of a second emitter follower including a second emitter-follower transistor having a base coupled to the first one of the first and second electrodes of the second transistor and an emitter coupled to the gate of the second separator transistor.

16. The amplifier of claim 15, wherein a base of a first diode-connected transistor is coupled to the first current source by means of the first separator transistor, and a base of a second diode-connected transistor is coupled to the second current source by means of the second separator transistor.

17. The amplifier circuitry of claim 1, wherein the control circuitry includes a second separator transistor; wherein a gate of the first separator transistor is coupled to the first one of the first and second electrodes of the first transistor by means of a first emitter follower including a first emitter-follower transistor having a base coupled to the first one of the first and second electrodes of the first transistor and an emitter coupled to the gate of the first separator transistor; and wherein a gate of the second separator transistor is coupled to the first one of the first and second electrodes of the second transistor by means of a second emitter follower including a second emitter-follower transistor having a base coupled to the source of the second input transistor and an emitter coupled to the gate of the second separator transistor.

18. The amplifier circuitry of claim 17, wherein the bias current circuitry includes a current source; wherein a base of a first diode-connected transistor is coupled to the current source by means of the first separator transistor; and wherein a base of a second diode-connected transistor is coupled to the current source by means of the second separator transistor.

* * * * *